United States Patent [19]
Fredrickson

[11] Patent Number: 5,257,272
[45] Date of Patent: Oct. 26, 1993

[54] TIME-VARYING MODULO N TRELLIS CODES FOR INPUT RESTRICTED PARTIAL RESPONSE CHANNELS

[75] Inventor: Lyle J. Fredrickson, Sunnyvale, Calif.

[73] Assignee: International Business Machines Corporation, Armonk, N.Y.

[21] Appl. No.: 869,286

[22] Filed: Apr. 15, 1992

[51] Int. Cl.$^5$ .................................. G06F 11/10
[52] U.S. Cl. ................................... 371/43; 360/40
[58] Field of Search .................. 360/40; 371/43, 44; 341/59, 68

[56] References Cited

U.S. PATENT DOCUMENTS

| | | | |
|---|---|---|---|
| 4,786,890 | 11/1988 | Marcus et al. | 341/81 |
| 4,888,779 | 12/1989 | Karabed et al. | 371/43 |
| 4,945,538 | 7/1990 | Patel | 371/43 |
| 5,136,593 | 8/1992 | Moon et al. | 371/43 |

OTHER PUBLICATIONS

H. K. Thapar and A. M. Patel, "A Class of Partial Response Systems for Increasing Storage Density in Magnetic Recording," IEEE Transactions in Magnetics, vol. MAG-23, No. 5, Sep. 1987.

R. Adler, D. Coppersmith, and M. Hassner, "Algorithms for Sliding Block Codes," IEEE Transactions on Information Theory, vol. IT-29, No. 1, Jan. 1983.

L. J. Fredrickson and J. K. Wolf, "Error Detecting Multiple Block (d,k) Codes," IEEE Transactions on Magnetics, vol. MAG-25, No. 5, Sep. 1989.

*Primary Examiner*—Vincent P. Canney
*Attorney, Agent, or Firm*—Henry E. Otto, Jr.

[57] ABSTRACT

A method and apparatus for generating high rate run length limited trellis codes and increasing minimum distance between output sequences of partial response channels with constrained channel inputs without requiring codes with spectral nulls. A Viterbi detector replicates a conventional trellis structure for the channel N times. The N copies of the channel response trellis are interconnected such that a preselected function associates each state in the trellis with a particular integer value modulo N. The number N is selected according to the channel detection and coding constraints so that diverging erroneous sequences of minimum distance lead to detector states which are distinct from the correct detector state. The detector trellis is time-varying such that only certain values of the preselected function are allowed every m bits. The time-variation assures there are no minimum distance extensions of erroneous sequences beyond a predetermined length. Reliability of storage channels is desirably increased, because more noise is required to overcome the additional distance and cause an error in distinguishing the correct encoded sequence.

21 Claims, 9 Drawing Sheets

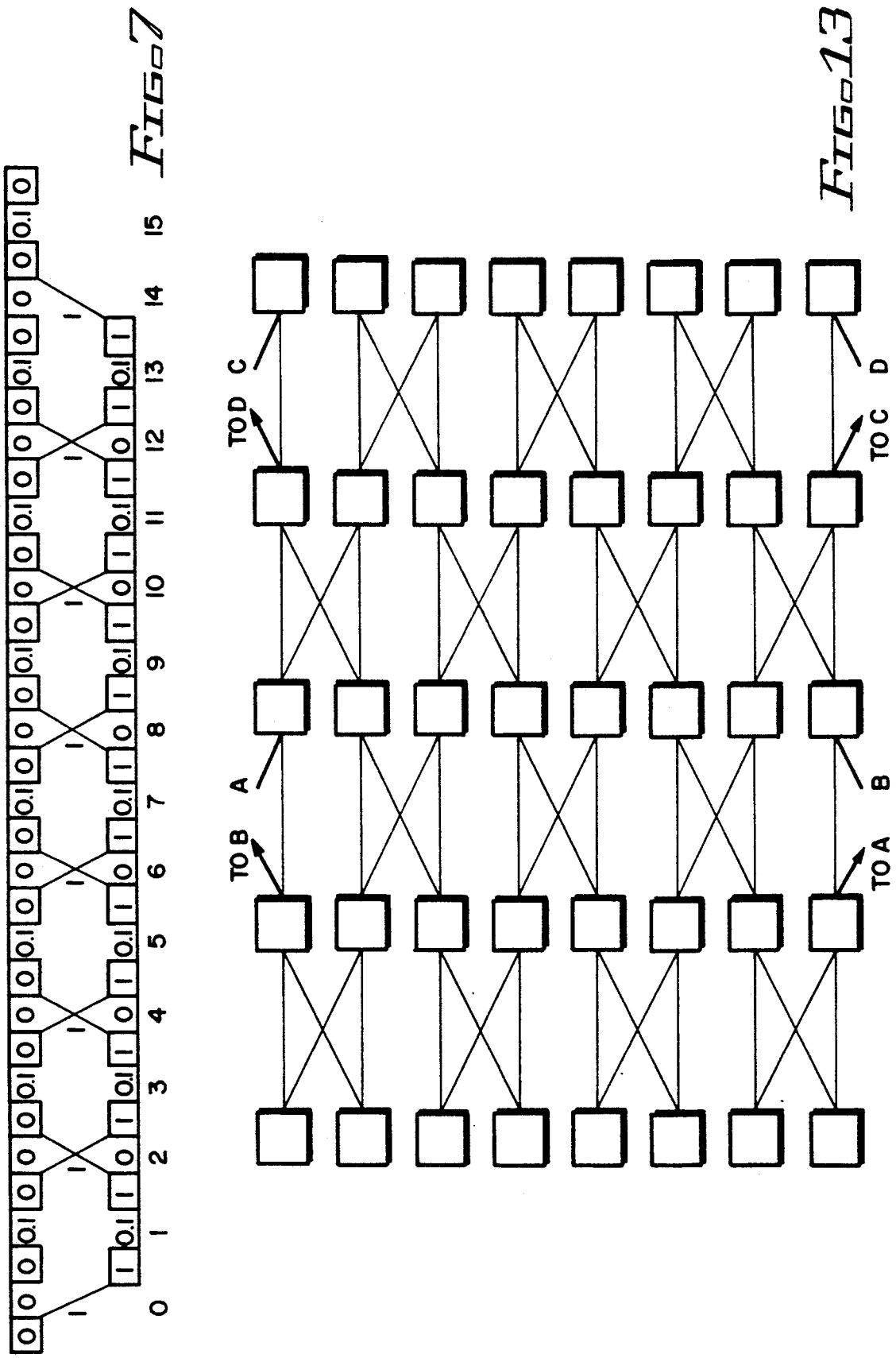

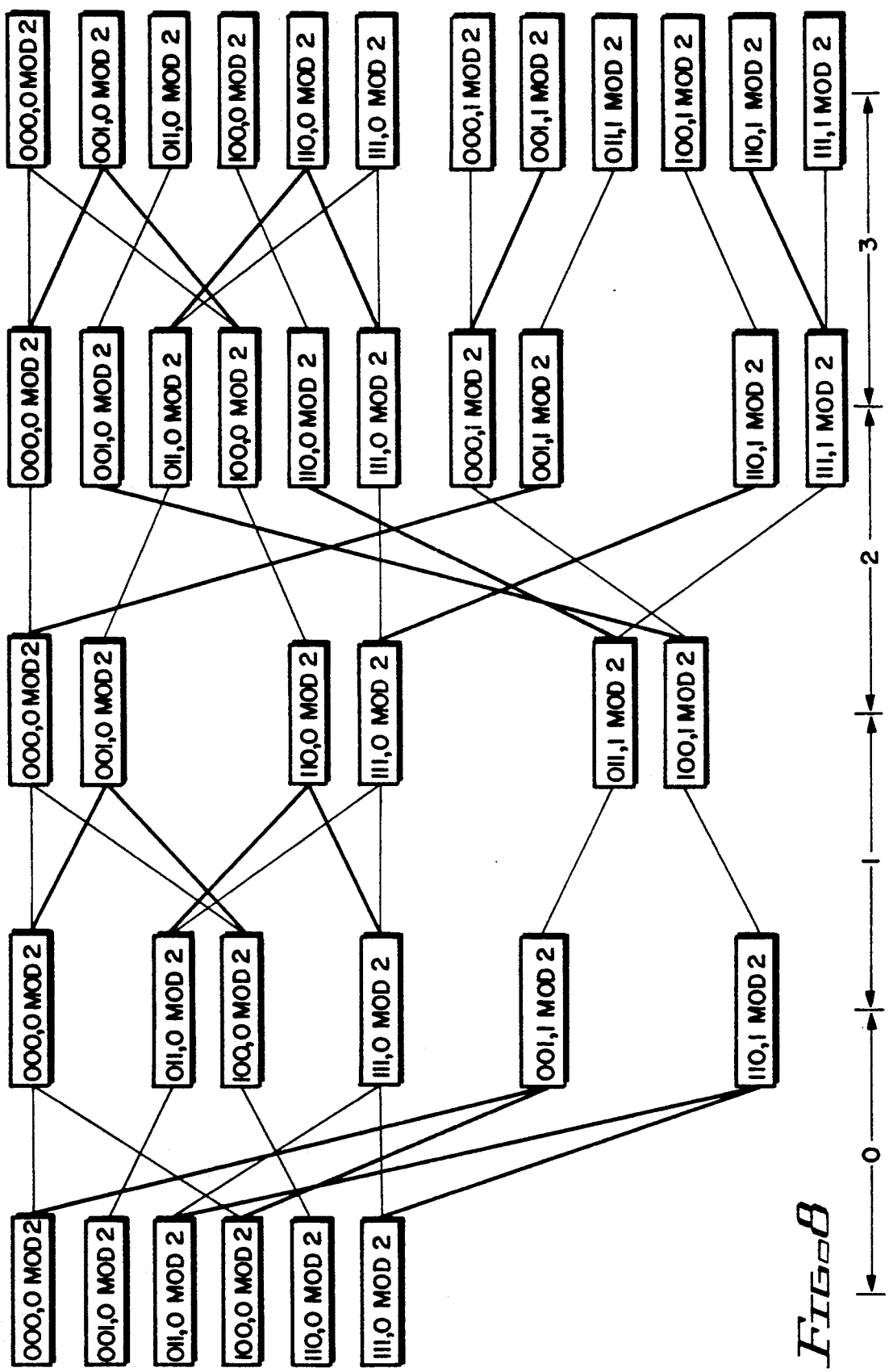

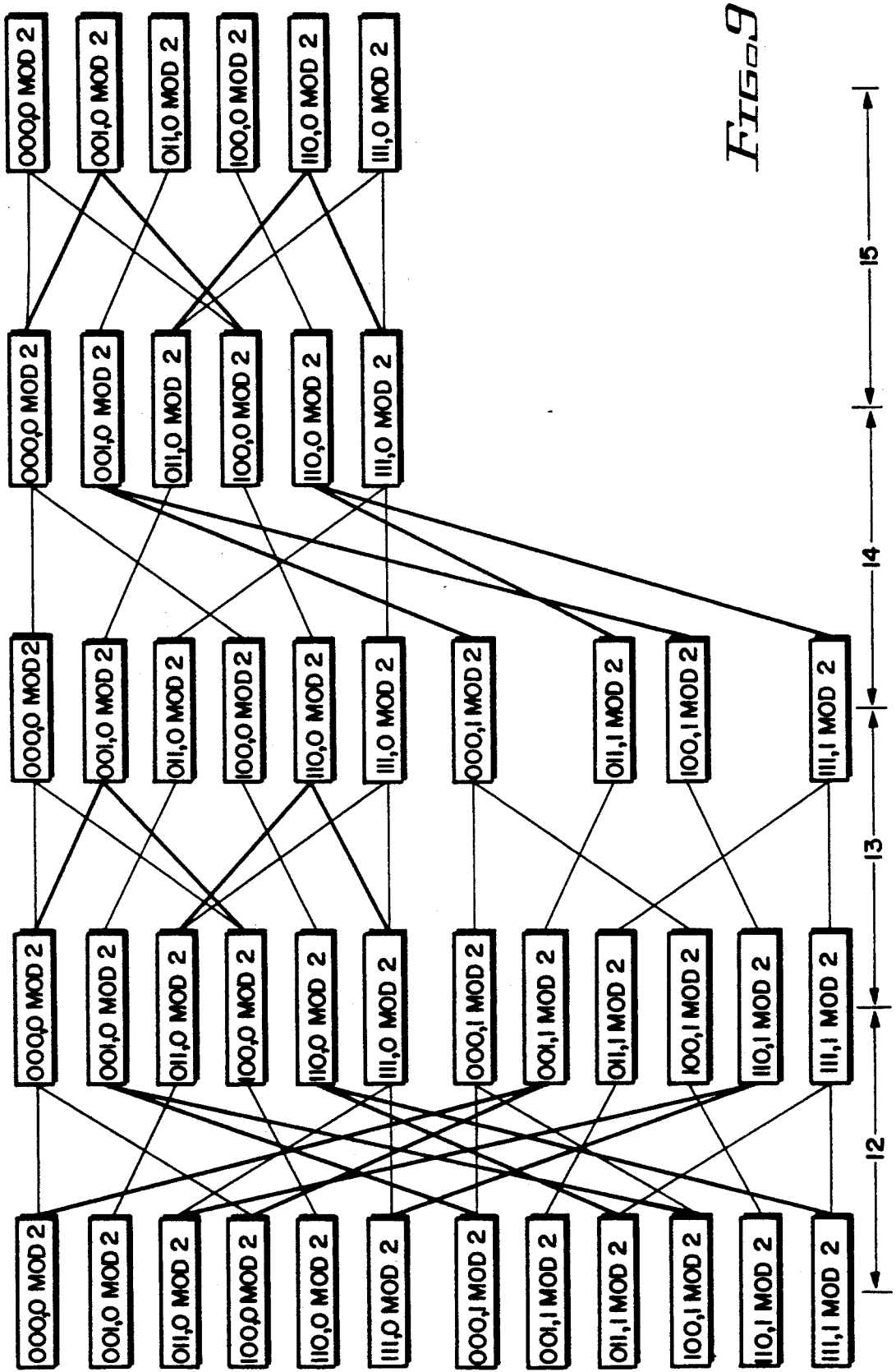

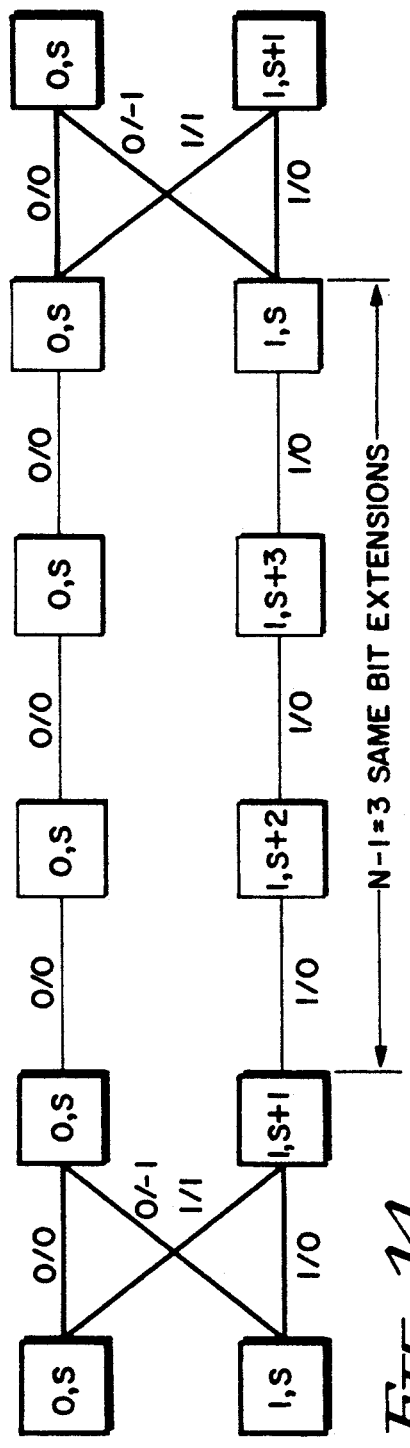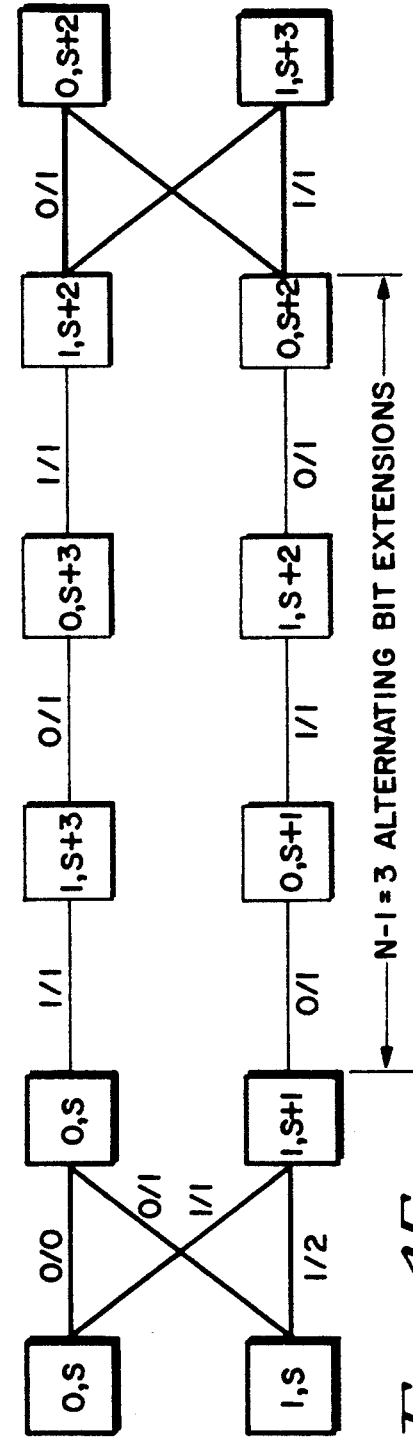
FIG. 14
FIG. 15

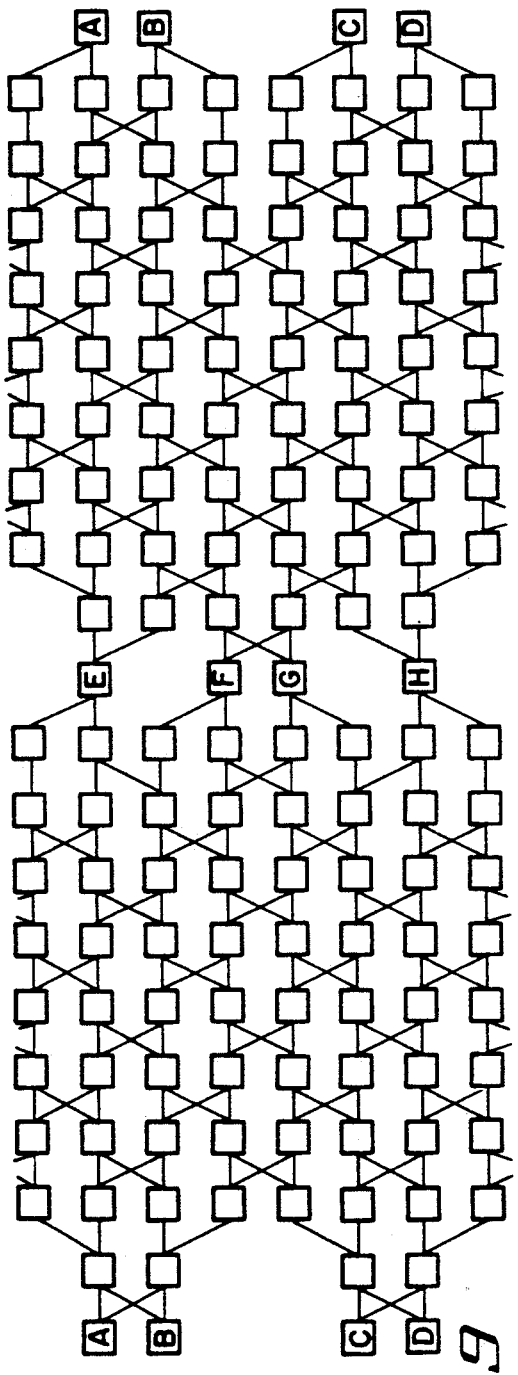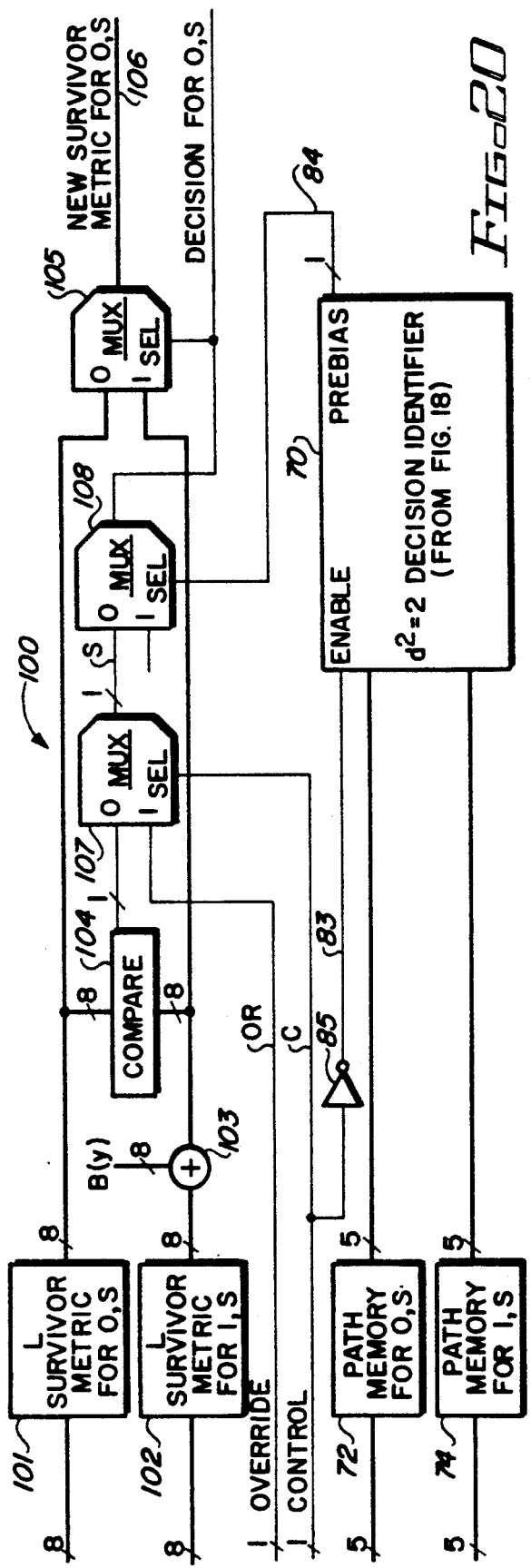

TIME-VARYING MODULO N TRELLIS CODES FOR INPUT RESTRICTED PARTIAL RESPONSE CHANNELS

CROSS REFERENCE TO RELATED APPLICATION

U.S. application Ser. No. 7/869,570, (Docket SA9-91-100) filed concurrently herewith, entitled, "Time-Varying Viterbi Detector for Control of Error Event Length".

FIELD OF THE INVENTION

This invention relates to techniques for transmitting binary digital data over partial response channels. More particularly, it relates to a method and apparatus, using high rate modulation run length limited codes and associated detectors, for improving the reliability of data storage devices by increasing the minimum distance between output sequences of partial response channels.

BACKGROUND OF THE INVENTION

The following prior art references are considered by applicant to be the most pertinent to the present invention:

[A] H. K. Thapar and A. M. Patel, "A Class of Partial Response Systems for Increasing Storage Density in Magnetic Recording," IEEE Transactions on Magnetics, vol. MAG-23, No. 5, September 1987.

[B] U.S. Pat. No. 4,786,890, granted Nov. 22, 1988, entitled "Method and Apparatus for Implementing a PRML Code."

[C] U.S. Pat. No. 4,888,779, granted Dec. 19, 1989, entitled "Matched Spectral Null Trellis Codes for Partial Response Channels."

[D] R. Adler, D. Coppersmith, and M. Hassner, "Algorithms for Sliding Block Codes," IEEE Transactions on Information Theory, vol IT-29, No. 1, January, 1983.

[E] L. J. Fredrickson and J. K. Wolf, "Error Detecting Multiple Block (d,k) Codes," IEEE Transactions on, Magnetics, vol. MAG-25, No. 5, September, 1989.

High rate run length limited (RLL) trellis codes and associated Viterbi detectors have heretofore been proposed for various partial response channels. Partial response channels of interest for data storage devices include those with channel polynomials of the form $P(D)=(1-D)(1+D)^n$, where n is a nonnegative integer. Reference [A] notes that a $(1-D)$ dicode channel, a PR4 $(1-D^2)$ channel, and an EPR4 $(1+D-D^2-D^3)$ channel are useful for magnetic recording channels. Partial response channels PR1 $(1+D)$, and $(1+D^2)$, are preferred for optical recording channels.

Partial response channels $(1+D^n)$ or $(1-D^n)$ have a practical implementation advantage in that they can be deinterleaved into n $(1+D)$ or $(1-D)$ channels, respectively. In Reference [B], PR4 detection is accomplished by interleaving two $(1-D)$ dicode detectors. In Reference [C], coding and detection for these channels is accomplished by interleaving appropriate dicode or PR1 channel codes.

Coding constraints are generally imposed which improve the reliability of data recovery. These constraints may require regular updates of timing and gain control loops and/or limitation of the length of divergent error events, as discussed in References [B] and [C]. Reference [D] discusses the incorporation of the usual (d,k) runlength constraints in codes for magnetic channels.

Reference [C] discloses a method for increasing the reliability of partial response storage channels, by increasing the minimum distance between coded output sequences using codes designed to match the spectral nulls in a channel partial response polynomial. The Viterbi detectors in Reference [C] have reduced complexity, achieved by tracking the spectral content of detected sequences.

Reference [C] also describes a method for eliminating "quasi-catastropic sequences" which are defined as sequences that are represented by more than one distinct path through the detector trellis. The "minimum distance" of a particular detector trellis (sometimes referred to in the art as $d^2_{free}$) is defined as the minimum sum of the squared differences between noiseless sample values resulting from two distinct sequences that diverge from a common state on the trellis and remerge to a common state. For partial response, maximum likelihood (PRML) detection, $d^2_{free}$ is 2, but the first order matched spectral null codes of Reference [C] increase $d^2_{free}$ to 4.

Reference E discusses the design of error detection codes for minimum run length d=1 input restricted channels which rely on tracking the sum of the positions of NRZI ones modulo 2. Because a minimum distance error is made by shifting an NRZI one to an adjacent bit position, an NRZI one, originally in an odd (even) numbered position, is misdetected in an even (odd) numbered position, changing the modulo 2 sum of positions of NRZI ones. In Reference [E], error detection codes use prior knowledge of the modulo 2 sum of the positions of NRZI ones over a span of m bits in an encoded sequence to determine whether a minimum distance event has occurred. However, it should be noted that the channel in Reference [E] is a peak detected Lorentzian channel, and no reference is made to partial response channels or the detection thereof.

The referenced related application describes Viterbi detectors for matched spectral null codes with a trellis structure in which a predetermined number of states and edges are deleted in a preselected time-dependent pattern to create a time-varying trellis which significantly limits the maximum lengths of minimum distance error events.

However, these references and the related application do not teach or suggest a Viterbi detector which provides a time-varying trellis for a run-length-limited (RLL) code, wherein only certain values of a preselected attribute tracked modulo N are allowed every m bits, to increase the minimum distance between output sequences of a partial response channel and to eliminate quasi-catastrophic sequences for increasing the reliability of data storage devices.

SUMMARY OF THE INVENTION

According to the invention, a method and apparatus are described for generating high rate run-length-limited trellis (RLL) codes and designing the associated detectors which increases the minimum distance between output sequences of partial response channels with constrained channel inputs.

More particularly, trellis codes and Viterbi detectors are designed for partial response channels having characteristic polynomials of the form $P(D)=(1\pm D^n)$, where n is a positive integer, and $P(D)=(1+D-D^2-D^3)$. The Viterbi detector replicates a conventional trellis pattern for the desired channel N times. The N copies of the channel response trellis are interconnected in such a way that a preselected function associates each state in the trellis with a particular integer value modulo N. The number N is selected according to the channel detection and coding constraints so that diverging erroneous sequences of minimum distance lead to detector states which are distinct from the correct detector state.

The detector trellis is time-varying in such a way that only certain values of the preselected function are allowed every m bits. The time-variation is provided such that there are no minimum distance extensions of erroneous sequences beyond a predetermined length. In this manner, the reliability of storage channels is desirably increased, because more noise is required to overcome the additional distance and cause an error in distinguishing the correct encoded sequence.

BRIEF DESCRIPTION OF THE DRAWINGS

FIG. 7 is a time-varying modulo 2 trellis, according to the invention, for tracking the parity of the even positions of NRZI ones.

FIG. 8 depicts how, according to the invention, the twelve states of the trellis of FIG. 6 are made time-varying in the first four bits of each sixteen bit block.

FIG. 9 depicts how, according to the invention, the twelve states of the trellis of FIG. 6 are made time-varying in the last four bits of each sixteen bit block.

FIG. 13 is a simplified representation of a trellis of the types shown in FIG. 11 and FIG. 12;

FIG. 14 depicts minimum distance error events for the $(1-D)$ trellis of FIG. 11.

FIG. 15 depicts minimum distance error events for the $(1+D)$ trellis of FIG. 12.

FIG. 19 depicts, according to the invention, a time-varying modulo 4 trellis for the $(1-D)$ or $(1+D)$ channel.

FIG. 20 depicts, according to the invention, a circuit diagram showing incorporation of the circuits depicted in FIGS. 16-18 in the add-compare-select (ACS) unit of a time-varying Viterbi detector.

PRELIMINARY DESCRIPTION—PRIOR ART

Figure 1:
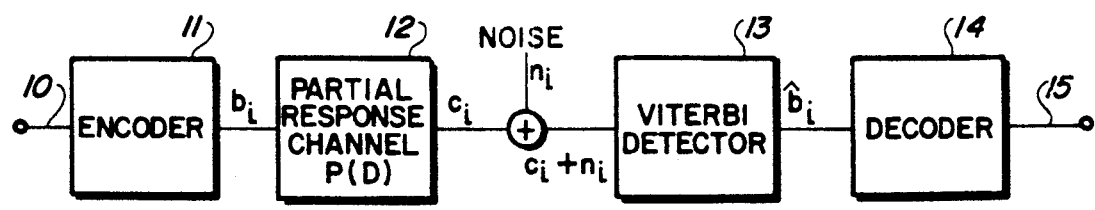
FIG. 1 depicts a block diagram of a data storage system comprising an encoder, a partial response channel corrupted by noise, a detector, and a decoder, as known in the prior art.

As depicted in FIG. 1, input data, such as in the form of binary symbol strings, is transmitted from a bus 10 to an encoder 11. Encoder 11 produces a binary code symbol sequence which serves as input to a partial response channel 12. A channel output sequence is generated by partial response channel 12, corrupted by noise and detected at the channel output by a Viterbi detector 13. Detector 13 calculates and estimates, from the channel output sequence, the most probable coded sequence. A decoder 14 uses this estimate, as calculated by detector 13, to recover the original input data and output it to a bus 15.

For each partial response channel polynomial P(D) considered, the channel state consists of the most recent j NRZ channel input bits, where j is the degree of the polynomial. In certain examples, it is convenient to use NRZI notation to describe events. To distinguish the notation herein, NRZI input bits are labelled $a_i$, and are related to NRZ input bits $b_i$ by $a_i = b_i$ XOR $b_{i-1}$, where XOR refers to the logical exclusive-or function. Some of the channels considered incorporate (d,k) runlength constraints in the detector. A (d,k) constrained sequence requires at least d and at most k NRZI zeroes between NRZI ones.

Let $b = \{b_0, b_1, \ldots, b_m\}$ be a sequence of NRZ channel input bits. It is convenient to use the delay operator D, the channel input polynomial b(D) where $$b(D) = \sum_{i=0}^{m} b_i D^i,$$

and the partial response channel polynomial P(D), to find the noiseless channel output polynomial c(D), where c(D)=P(D) b(D), as shown in FIG. 1.

Figure 2:
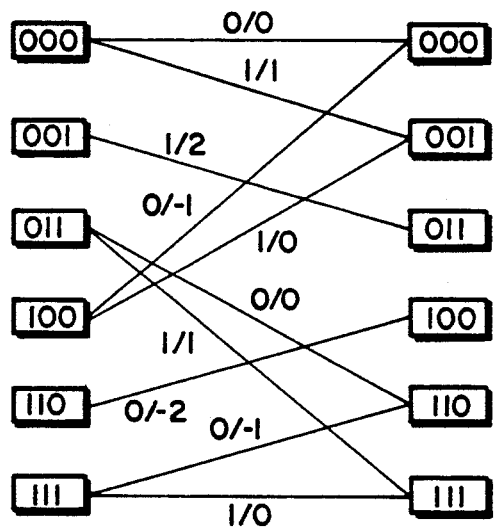
FIG. 2 depicts a combined Viterbi detector trellis for a (d,k) run-length-limited code wherein d=1, and the channel is an EPR4 $(1+D-D^2-D^3)$ input restricted channel, as known in the prior art.

FIG. 2 depicts a trellis structure characterizing a six state Viterbi detector for a minimum run length d=1 input-restricted EPR4 channel. Since the EPR4 channel state is characterized by the previous three NRZ channel input bits, each channel state at time i is labelled with a three-tuple, $b_{i-3} b_{i-2} b_{i-1}$ and the noiseless channel response is given by $c_i = b_i + b_{i-1} - b_{i-2} - b_{i-3}$.

Note that channel states 101 and 010 are not included in FIG. 2, since they do not occur in a d=1 input-restricted EPR4 channel. Each branch in FIG. 2 has a two-component label (such as 0/0), where the first component is the NRZ channel input bit $b_i$ and the second component is the noiseless channel response associated with the corresponding succession of channel states.

Figure 3:
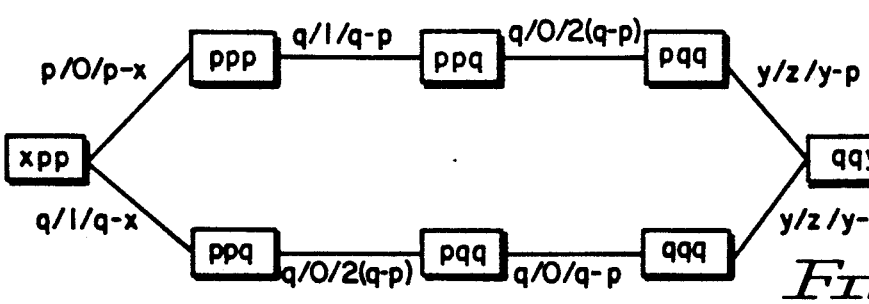
FIG. 3 depicts the minimum distance sequences for the prior art trellis illustrated in FIG. 2.

FIG. 3 depicts the minimum distance error event for a d=1 EPR4 trellis, with a minimum distance $d^2_{free}=4$ in which a correct sequence and a minimum distance erroneous sequence (herein called "minimum distance neighbors") diverge from a common state. This common state must have a label of the form xpp, where x is arbitrary, and p is the common value of previous channel inputs required to satisfy the d constraint such as states 000,011,100 and 111 in FIG. 2. In FIG. 3, the bit label q is used to indicate the complement of p. The squared difference between the noiseless sample values on the diverging branches is 1. The sequences eventually remerge to a common state labelled qqy, where y is arbitrary, and accumulate a total minimum distance of 4, equal to the sum of the squared differences of noiseless sample values.

This error event is conveniently characterized in NRZI notation. Each branch in FIG. 3 has three-component label, such as p/0/p-x where the first component is the NRZ channel input bit $b_i$, the second is the NRZI channel input bit $a_i$, and the third is the noiseless channel response associated with the corresponding succession of channel states. The minimum distance error event for the d=1 EPR4 channel involves minimum distance neighbors of the NRZI form w0010v and w0100v, where w and v are arbitrary.

Figure 4:
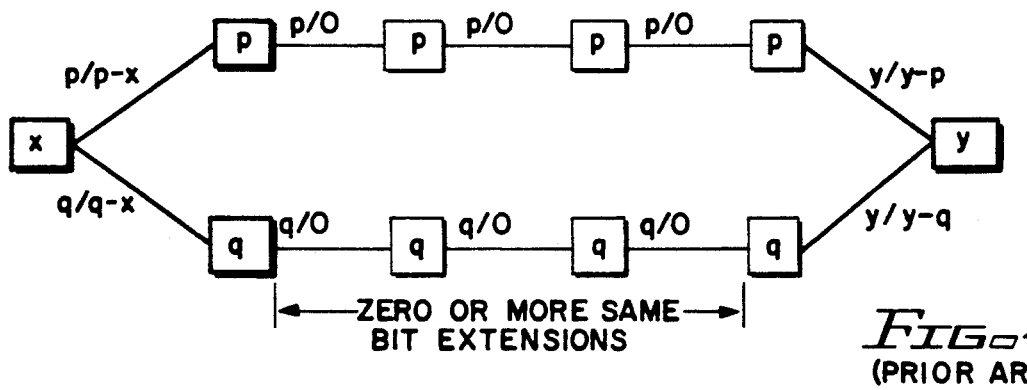
FIG. 4 depicts the minimum distance sequences for maximum likelihood detection of a dicode $(1-D)$ channel, as known in the prior art, for magnetic recording.

FIG. 4 depicts the minimum distance event for detection of a dicode channel having a conventional trellis structure such as disclosed in Reference [B]. In FIG. 4, each branch has a two-component label, where the first component is the NRZ channel input bit $b_i$ and the second is the noiseless channel response associated with the corresponding succession of channel states. The sequences diverge from a state labelled x, where x is arbitrary, and eventually remerge to a state labelled y, where y is arbitrary, and accumulate a total distance of 2.

Figure 5:
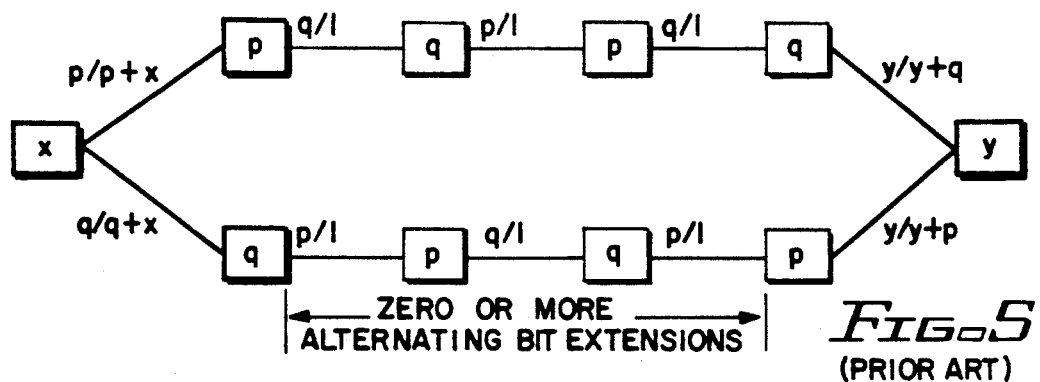
FIG. 5 depicts the minimum distance sequences for maximum likelihood detection of a PR1 $(1+D)$ channel, as known in the art, for optical recording.

FIG. 5 depicts the minimum distance event for a PR1 channel having a conventional trellis structure, such as disclosed in reference [C]. In FIG. 5, the branches have two component labels similar to those in FIG. 4.

PRELIMINARY DESCRIPTION—PRESENT INVENTION

According to the invention, alternative methods are described for achieving increases in coded minimum distance similar to those obtained in Reference [C] with first order spectral nulls, without requiring spectral nulls. In some cases, the resulting codes provide higher code rates for a given number of states than are possible using the methods of Reference [C].

The method used by applicant to increase minimum distance includes the steps of:

(i) preselecting a weighting function $\Phi$ which maps each encoded sequence of channel input bits, in NRZ or NRZI notation, to an integer value modulo N, (ii) interconnecting n Viterbi detectors, each having m channel states, each such state representing the most recent input to the partial response channel, for creating a modified trellis structure for a modified Viterbi detector having n times m states each representing a combination of a channel state and a particular value of the weighting function;

(iii) determining the value of N and channel input and detector constraints which ensure that sequences of minimum distance emanating from a common state in the modified detector lead to different detector states, (iv) deleting, from the modified detector trellis, states and/or edges emanating from the trellis states in order to eliminate multiple paths with identical noiseless sample values, and (v) selecting a code which is a subset of nonquasi-catastrophic sequences that correspond to permissible paths through the modified detector trellis.

DESCRIPTION OF PREFERRED EMBODIMENTS

I. For Minimum Run Length d=1 Input Restricted EPR4 Channels

For EPR4 channels, the detector trellis is constricted using weighting function, generically expressed as $\Phi:\{a_0, a_1, a_2, \ldots, a_i\} \rightarrow Z_n$ as referred to in method step (i) above. Function $\Phi$ assigns a unique value modulo N to each sequence of i channel input bits in NRZI notation, where $$\Phi(\{a_0, a_1, \ldots, a_i\}) = S = \left(\sum_{j=0}^{i} w_j a_j\right) \text{modulo } N,$$

This expression is a weighted sum modulo N of the NRZI bits using preselected weights $\{w_0, w_1, \ldots, w_i\}$.

Minimum distance events of distance $d^2_{free}=4$ were described above in the Background section. A code described in Appendix A hereof contains no events of distance 4. An attribute which distinguishes a coded input sequence from minimum distance neighbors is the sum of even (or odd) positions of NRZI ones modulo 2. Appropriate weights for evaluating the sum of even positioned NRZI ones are given by $w_{2j}=1$ and $w_{2j+1}=0$. In this example, $$T = \sum_{2j \leq i} a_{2j}$$

which is the sum of even numbered positions of NRZI ones up to time i.

Figure 6:
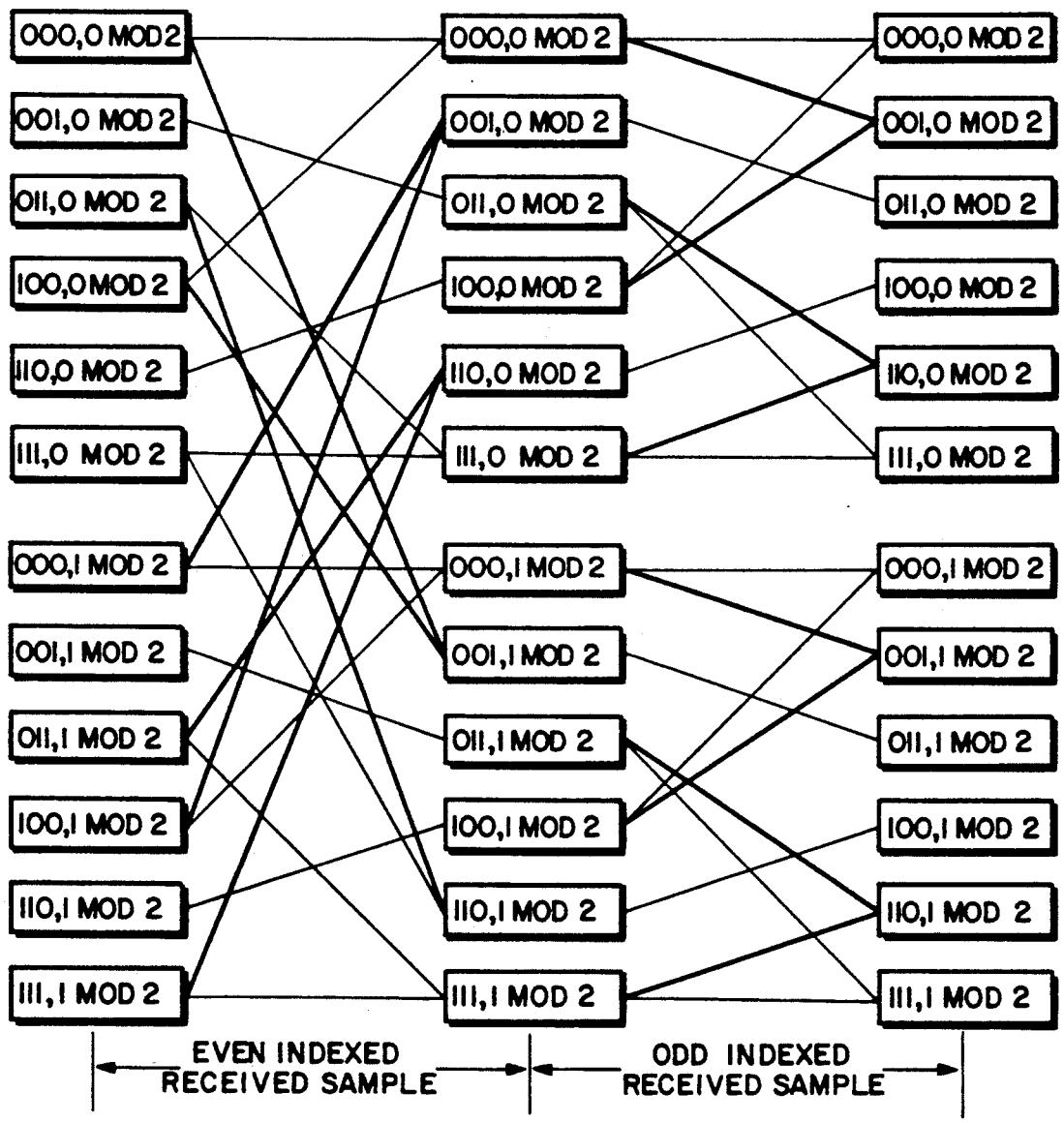
FIG. 6 depicts how, according to the invention, the six states of the trellis of FIG. 1 are modified to obtain twelve states.

According to method step (ii) above, the Viterbi detector trellis is constructed in which the various trellis states are associated with distinct values of S=T modulo N. FIG. 6 discloses a detector trellis for N=2. In FIG. 6 each detector state has a two-component label in which the first component indicates the channel state (e.g. 110), and the second component (e.g., 1 mod 2) indicates the value of S modulo 2. Since an event with a minimum distance ($d^2_{free}$) of 4 results in a change of one in S, a detector with N=2 satisfies method step (iii) for distance 4 events without additional detector constraints. Branches corresponding to NRZI ones are highlighted by thickened lines in FIG. 6 to show the change in S caused by NRZI ones in even numbered positions.

In the EPR4 detector disclosed in FIG. 6, minimum distance sequences which diverge from a common state in the trellis lead to detector states with distinct values of S. Quasi-catastrophic behavior resulting from pairs of paths with identical noiseless sample values must be eliminated from the code and/or detector to guarantee that increased reliability is achieved with a path memory of finite length. A pair of paths with identical noiseless sample values have identical channel inputs, and provide equal contributions to the value of S. As a result, minimum distance divergent paths retain different values of S. In the referenced related application, methods are disclosed for incorporating a time varying detector trellis to minimize the lengths of quasi-catastrophic paths.

FIG. 7 depicts a time-varying modulo 2 trellis, which indicates time-varying allowed values of S that eliminate all quasi-catastrophic sequences. Each state is labelled with the value of S, and branches are labelled with the allowed value of NRZI input bits $a_i$ which result in the depicted state transitions. As shown in FIG. 7, only one value of S is allowed every 16 bits and the bit indices are specified along the bottom of the figure and correspond to those specified in FIGS. 6, 8 and 9, which in combination depict the entire time-varying trellis for modulo 2 minimum run length $d=1$ input restricted EPR4.

More specifically, FIG. 8 depicts the interconnection of the twelve-state trellis for the first four bits of each sixteen-bit block, as specified along the bottom of the figure. All sequences start with $S=0$ in the first bit of each block. After the third bit in each block, all states are fully connected as shown in FIG. 6 for bit indices 4, 5, 6, 7, 8, 9, 10, and 11. FIG. 9 shows the interconnection of the twelve-state trellis for the last four bits of each sixteen-bit block, as specified along the bottom of the figure. All sequences end with $S=0$ in the last bit of each block.

Figure 10:
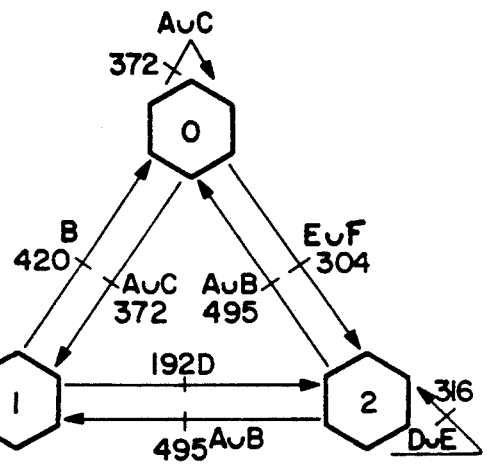
FIG. 10 depicts, according to the invention, a symbolic representation of a three state rate 10/16 encoder for a modulo 2 EPR4 code.

The available sequences (i.e. those corresponding to paths through the time-varying trellis) are used to derive the code described in step (v) above by applying sliding block methods, such as described in Reference [D]. FIG. 10 discloses a symbolic representation of a three-state encoder for the rate 10/16 code specified in Appendix A for the minimum run length $d=1$ input restricted $d=1$ EPR4 channel.

II. For Dicode and PR1 channels

For $(1-D)$ dicode and $(1+D)$ PR1 channels, a method for generating high rate trellis codes is disclosed which uses a weighting function $\Phi:\{b_0, b_1, b_2, \ldots, b_i\} \rightarrow Z_n$ of the form $$\Phi(\{b_0, b_1, b_2, \ldots, b_i\}) = S = \left(\sum_{j=0}^{i} w_j b_j\right) \text{modulo } N,$$

This expression constitutes a weighted sum modulo N of the NRZ bits using preselected weights $\{w_0, w_1, \ldots, w_i\}$.

For dicode channels, the weighting coefficient is $w_j=1$ for all j. For PR1 channels, the weighting coefficients are, $w_{2j}=1$ and $w_{2j+1}=-1$ for each j.

Figure 11:
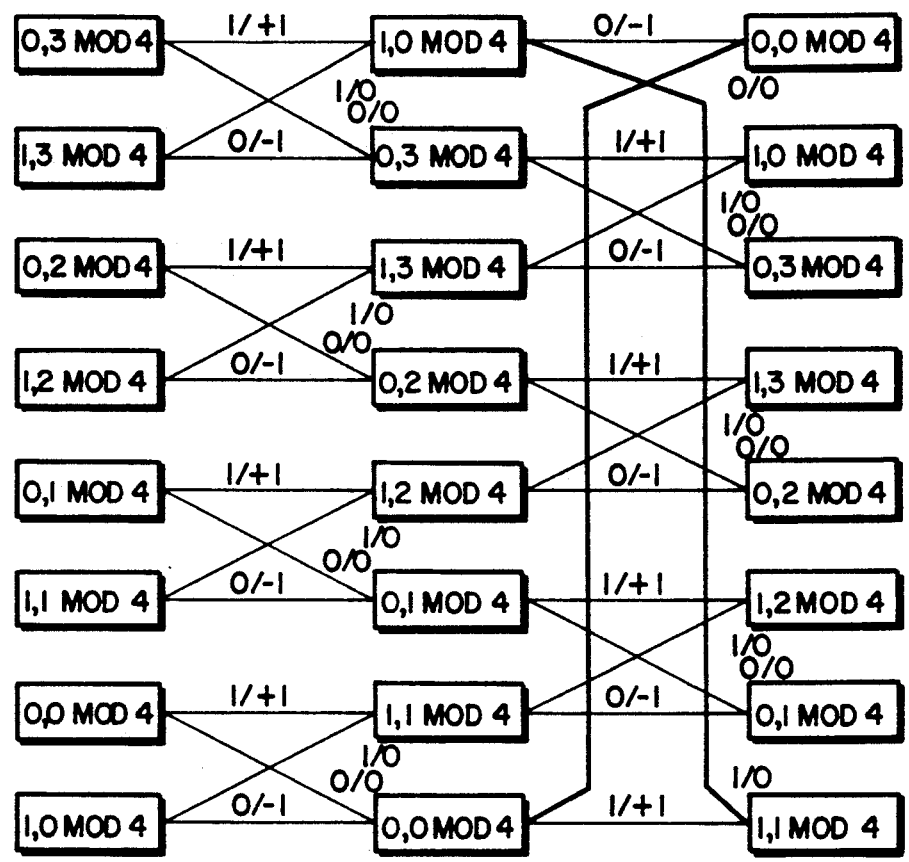
FIG. 11 depicts how, according to the invention, the two states of the dicode trellis $(1-D)$ are modified to obtain eight states.
Figure 12:
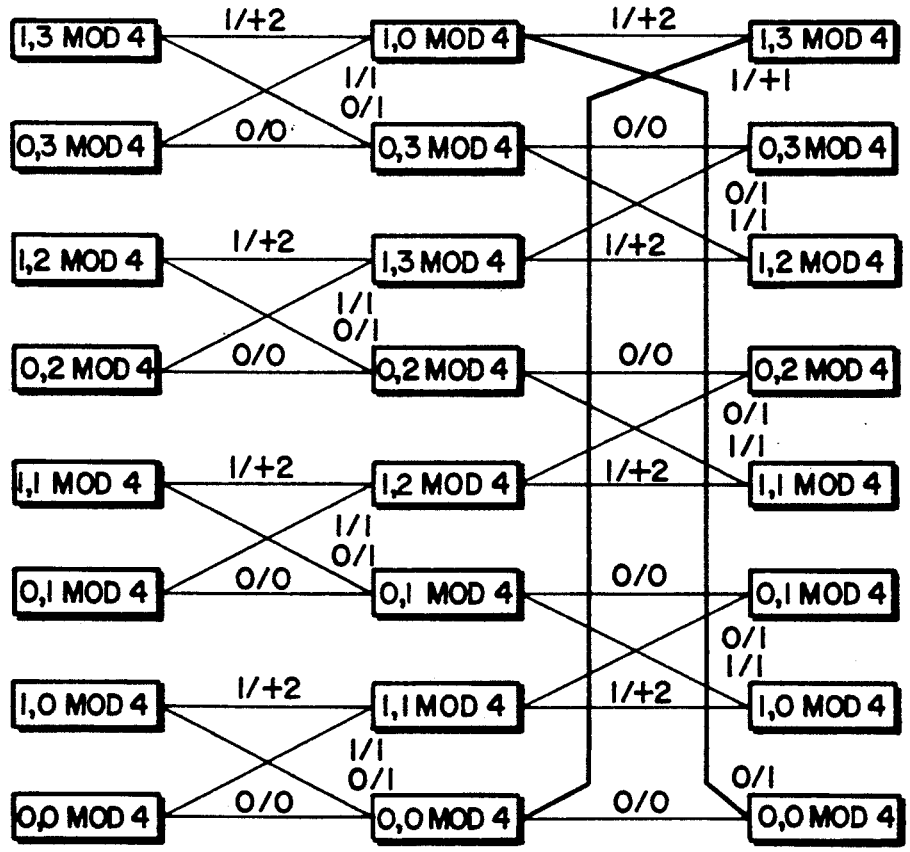
FIG. 12 depicts how, according to the invention, the two states of the $(1+D)$ PR1 trellis are modified to obtain eight states.

FIG. 11 depicts the trellis structure for dicode channels with $N=4$, while FIG. 12 depicts the trellis structure for PR1 channels with $N=4$. In each of these figures, each state has a two-component label, in which the first component is the previous NRZ channel input, $b_{i-1}$, and the second is the appropriate modulo 4 sum, S. Each branch has a two-component label (e.g. as 0/−1) in which the first component is the NRZ channel input, $b_i$, and the second is the noiseless channel response. FIGS. 11 and 12 depict two-bit intervals, and have identical structures despite different labelling. FIG. 13 is a simplified drawing representing the structure of either FIG. 11 or FIG. 12 and depicts four-bit intervals. Branches emanating from the upper and lower states of FIG. 13 are used to represent the long, irregular, diagonal branches which are highlighted by the thickened lines in the second bit intervals of FIGS. 11 and 12.

Minimum distance ($d^2_{free}$) 2 events for dicode and PR1 channels are depicted in FIGS. 4 and 5, respectively. However, if two sequences on the trellises of FIG. 13 diverge from a common initial state, after r noiseless extensions which do not accumulate distance, (i.e., after r consecutive same bit extensions for the $(1-D)$ channel or r alternating bit extensions for the $(1+D)$ channel), the value of S for the two sequences differs by $(r+1)$ modulo N. Because of the structure of FIG. 13, the sequences can only remerge on the succeeding bit to a common state and complete a minimum distance event if they have a common value of S; i.e., if $(r+1)$ modulo $N=0$. With $N=4$ as shown in FIG. 13, minimum distance 2 events have $r \in \{3, 7, 11, \ldots\}$. FIG. 14 depicts minimum distance 2 events on the trellis of FIG. 11 with $r=3$. FIG. 15 depicts minimum distance 2 events on the trellis of FIG. 12 with $r=3$.

According to step (iii) above, a combination of coding and detector constraints must be imposed to ensure that minimum distance 2 events end on distinct detector states. Unlike the $d=1$ input restricted EPR4 channel earlier described in Section I, some of the minimum distance events described in the preceding paragraph must be eliminated from the code and/or detector. Asymptotically, the detector is most likely to make an error in a minimum distance decision between a coded sequence and some other trellis sequence. These decisions can be eliminated by use of the following strategies:

(A) selecting from available trellis sequences code sequences that do not require to eliminate minimum distance 2 decisions between a coded sequence and another trellis sequence, (B) prebiasing the decision of the detectors so that it favors one of the subsequences in each minimum distance event pair of subsequences, and using only the favored subsequences in the code, or (C) combining strategies (A) and (B).

For example, in FIG. 14, a minimum distance 2 event can occur if the detector has to distinguish between the NRZ sequences, $\{\hat{b}_{i-5}, \hat{b}_{i-4}, \hat{b}_{i-2}, \hat{b}_{i-1}, \hat{b}_i\} = \{0, 0, 0, 0, 0, 0\}$, and     10(A)

$\{\hat{b}_{i-5}, \hat{b}_{i-4}, \hat{b}_{i-2}, \hat{b}_{i-1}, \hat{b}_i\} = \{0, 1, 1, 1, 1, 0\}$,     10(B)

that connect state 0,S at time $(i-5)$ to state 0,S at time i.

Similarly, a minimum distance 2 event can occur if the detector has to distinguish between the NRZ sequences, $\{b_{i-5}, b_{i-4}, b_{i-2}, b_{i-1}, b_i\} = \{1, 0, 0, 0, 0, 0\}$, and     11(A)

$\{\hat{b}'_{i-5}, \hat{b}'_{i-4}, \hat{b}'_{i-2}, \hat{b}'_{i-1}, \hat{b}'_i\} = \{1, 1, 1, 1, 1, 1\}$,     11(B)

that connect state 1,S at time $(i-5)$ to state 0,S at time i.

All of the minimum distance 2 events with $r \geq 3$ involve a decision with at least one of each decision pair containing a subsequence with four or more consecutive same NRZ symbols. Therefore, all of the minimum distance 2 events can be eliminated by selecting a set of coded sequences which does not contain any subsequences with four or more consecutive same NRZ symbols. Therefore a minimum distance 4 code can be constructed using strategy (A).

Alternatively, according to the present invention and using strategy (B), all of the minimum distance 2 events in FIG. 14 can be eliminated by selecting a set of coded sequences and using, for each state, a prebiasing circuit and a preferred subsequence in each minimum distance 2 event pair of sequences. The prebiasing circuit 30 for the $(1-D)$ dicode trellis of FIG. 11 is disclosed in FIG. 16. Circuit 30 receives inputs from path memories 32, 34 containing previous decisions for detector states with labels 0,S and 1,S respectively, respectively generate as outputs $\hat{b}_{-1} \ldots \hat{b}_{i-5}$ for one subsequence and $\hat{b}'_{i-1} \ldots \hat{b}'_{i-5}$, for the other subsequence of a pair. Inverters 36a, b, c, d are interposed between outputs $\hat{b}_{i-1}$ to $\hat{b}_{-4}$ and an AND gate 38. Outputs $\hat{b}_{i-5}$ and $\hat{b}'_{i-5}$ are connected via an exclusive OR invert (XNOR) gate 40 to AND gate 38; and the remaining outputs $\hat{b}'_{i-1}$ to $\hat{b}'_{i-4}$ are connected directly to AND gate 38.

The outputs of inverters 36a–d are logical ones if $\hat{b}_{i-1}$ to $\hat{b}_{i-4}$ are NRZ zeros. The output of XNOR gate 40 is a logical one when the two subsequences $\hat{b}$ and $\hat{b}'1$ being compared emanate from a common trellis state. If the output of AND gate 38 is a logical one, minimum distance decisions must be made for the states with labels 0,S and 1,S+1, as depicted in FIG. 14.

Normally, when the output of AND gate 38 is a logical one, AND gates 42, 44 will be enabled by external control lines 46, 48 respectively, to cause circuit 30 to prebias the Viterbi detector to select the lower path (FIG. 14) for state 0,S and select the upper path (FIG. 14) for state 1, S+1. However, if the signal is down in either line 46 or 48, the prebiasing circuit 30 will be rendered inoperative for the state with label 0,S or 1,S+1, respectively.

Figure 16:
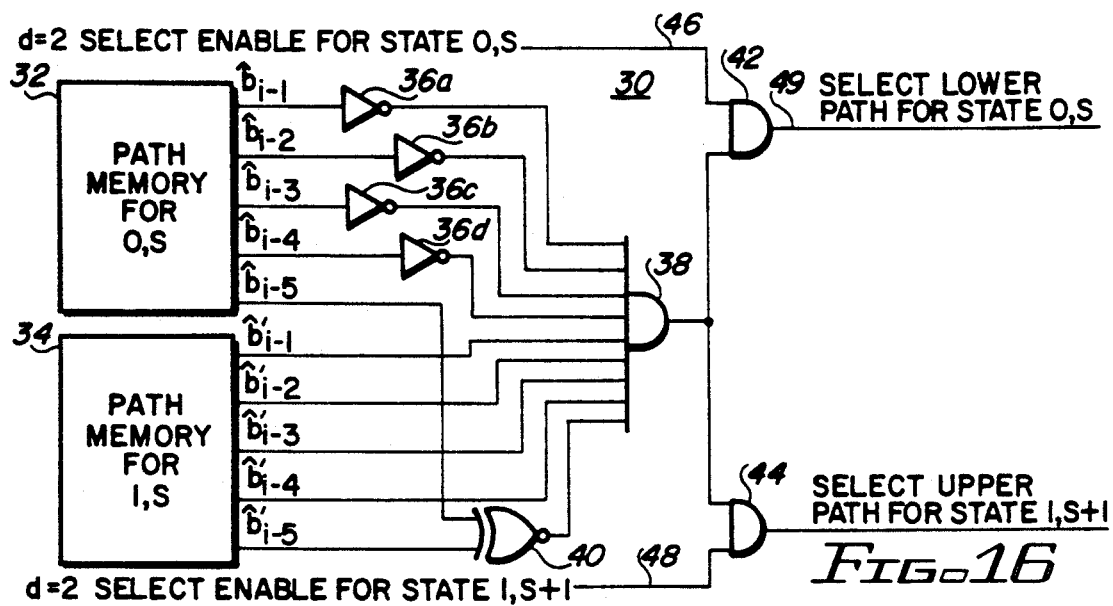
FIG. 16 depicts, according to the invention, a circuit diagram for prebiasing minimum distance decisions for the $(1-D)$ trellis of FIG. 11.

Thus, the circuit 30 of FIG. 16 calls for a prebiased decision when the output of AND gate 38 is a logical one because all of the following conditions exist:

$\hat{b}_{i-5} = \hat{b}_{i-5}$ $\hat{b}_{i-4} = \hat{b}_{i-3} = \hat{b}_{i-2} = \hat{b}_{i-1} = 0$, and $\hat{b}'_{i-4} = \hat{b}'_{i-3} = \hat{b}'_{i-2} = \hat{b}'_{i-1} = 1$.

Whether the detector selects subsequence (10A) and (10B) and (11A) or (11 B) in state 0,S of FIG. 14 is somewhat arbitrary and the subsequences selected can be chosen so as to optimize code parameters. As between subsequences (10A) and (10B), (10B) is generally preferred since it results in shorter run lengths and more frequent updates of timing and gain control loops. The choice (11 A) and (11 B) is not as clear cut because both result in the same run lengths. Accordingly, if AND gate 42 is enabled, the signal in control line 49 (select lower path for state 0,S) signifies that subsequence (11B) has been arbitrarily selected to be in the code; that subsequence (11A) is rejected by the detector when confronted with the choice between (11A) and (11 B); and that (10B) is preferred over (10A).

Figure 17:
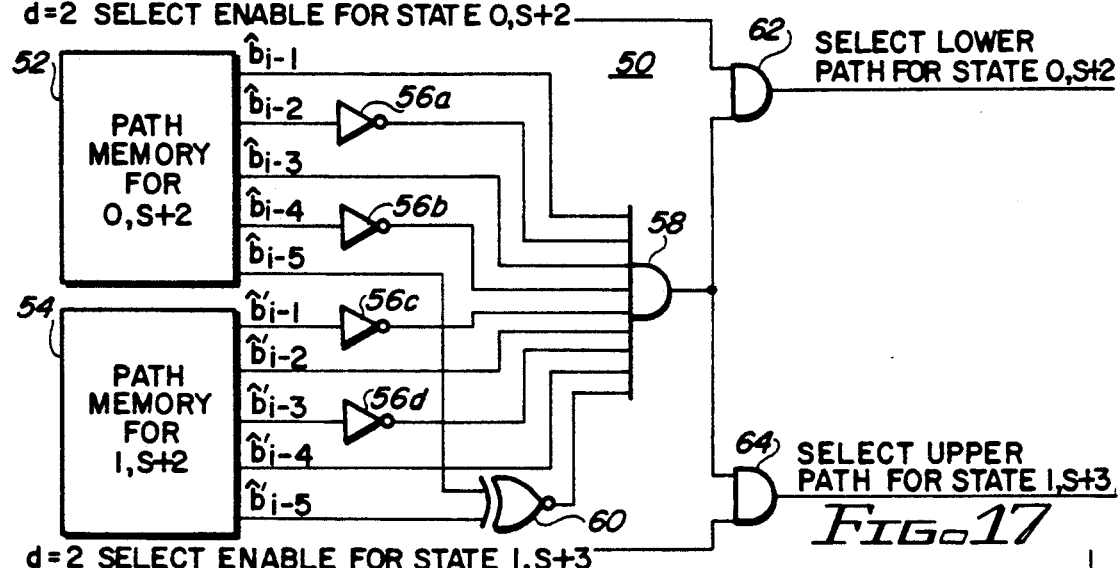
FIG. 17 depicts, according to the invention, a circuit diagram prebiasing minimum distance decisions for the $(1+D)$ trellis of FIG. 12.

A prebiasing circuit 50 for the $(1+D)$ PR1 trellis of FIG. 12 is disclosed in FIG. 17. It comprises path memories 52,54 inverters 56a, b, c, d AND gate 58, XNOR gate 60, and AND gates 62, 64. Operation of this circuit 50 and the conditions under which AND gate 58 will be enabled should be readily apparent in view of the detailed description of circuit 30.

As a third alternative, according to the invention and using strategy (C), all of the $d^2=2$ events in FIG. 14 can be eliminated by selecting a set of coded sequences, where each state has a limited prebiasing circuit and a preferred subsequence in each $d^2=2$ event prebiased pair, but neither subsequence in each unbiased $d^2=2$ event pair is used in the code. A limited prebiasing circuit 70 for the trellis of FIG. 11 is disclosed in FIG. 18 for state 0,S.

The output of circuit 70 indicates whether a $d^2=2$ minimum distance decision is required. Circuit 70 differs from that described in connection with FIG. 16 in that the input of AND gate 78 is connected to inverters 76e and 76f. Path memories 72, 74 are connected to circuit 70 by appropriate busses. Inverters 76 are are interposed between AND gate 78 and the path memory outputs $\hat{b}_{i-1}$ through $\hat{b}_{i-1}$ through $\hat{b}_{i-5}$ of one subsequence; and inverter 76f is interposed between the output $\hat{b}_{i-5}$ and AND gate 78. Whenever AND gate 82 is enabled by a signal in line 83 and a logical one output of AND gate 78, the need for a $d^2=2$ decision between subsequences (10A) and (10B) is identified, and subsequence (10B) is selected. To eliminate the need for a $d^2=2$ minimum distance decision between subsequences (11A) and (11B), a set of code sequences is selected in which each coded sequence does not contain a subsequence with five or more consecutive identical NRZ symbols.

FIG. 19 discloses the incorporation of the $d^2=2$ decision identifier into the time-varying trellis Viterbi detector, disclosed in the above cited related application.

FIG. 19 discloses a time-varying trellis for a modulo 4 code for the $(1-D)$ or $(1+D)$ channel using combination strategy (C). The code maps eight user bits to ten channel bits in NRZ notation in each encoding operation. The codewords used in this module 4 code, and coding details are specified in Appendix B.

APPARATUS FOR GENERATING THE TIME-VARYING TRELLIS

Applicant's invention is implemented by modified Viterbi detector 13 (FIG. 1) in combination with the encoder 11 and channel 12. The encoder 11, channel 12 and decoder 14 may be as described in the above-cited references, such as Reference [C].

According to the invention, Viterbi detector 13 comprises a plurality of add-compare-select (ACS) units 100 of the type illustrated in FIG. 20. Each unit 100 comprises latches 101, 102, and an adder 103, a comparator 104, a selector 105, and a multiplexer 107 (MUX) interposed between the comparator 104 and selector 105, as disclosed in the above cited related application.

The ACS units 100 implement the time variation in a trellis structure (such as that shown in FIG. 19) having at most two incoming edges per trellis state. Of these two edges, at most one incoming edge has a nonzero label. Let 1,S denote a state from which an incoming edge with nonzero sample label emanates (if such an edge exists); and let 0,S denote a state from which an edge with sample label 0 emanates (again, if such an edge exists).

In operation, at any time t, the survivor metric for state 0,S is stored in latch 101, and the survivor metric for state 1,S is stored in latch 102. Using a look-up table or simple arithmetic processor (not shown), separate from the trellis structure, a branch metric B(y) is computed for an edge with nonzero label when a sample y is received at time t+1. Adder 103 adds branch metric B(y) and the survivor metric for state 1,S generating a new state metric. Comparator 104 outputs a value of 0 or 1 according to whether the new state metric is smaller or larger than the metric for state 0,S.

In a conventional ACS unit, this quantity would trigger selector 105 to output the smaller metric to line 106 for storage (not shown). However, in the ACS unit 100 MUX 107 has inputs including not only the single bit output of comparator 104 but also a single bit override signal from line OR. Operation of MUX 37 is controlled by a single bit control signal in line C. Signals in these control and override lines C and OR are generated by a finite state machine (FSM) (not shown) as a function of the time step of the time-varying trellis structure. If the control signal in C has the value 0, ACS unit 100 will operate as a conventional ACS unit. However, if the control signal in C is set to 1, MUX 107 will be activated and allow the FSM to override the comparator 104 and generate a specified output S. Each ACS unit 100, as thus far described, is identical with that in the modified Viterbi detector described in the cited related application.

Figure 18:
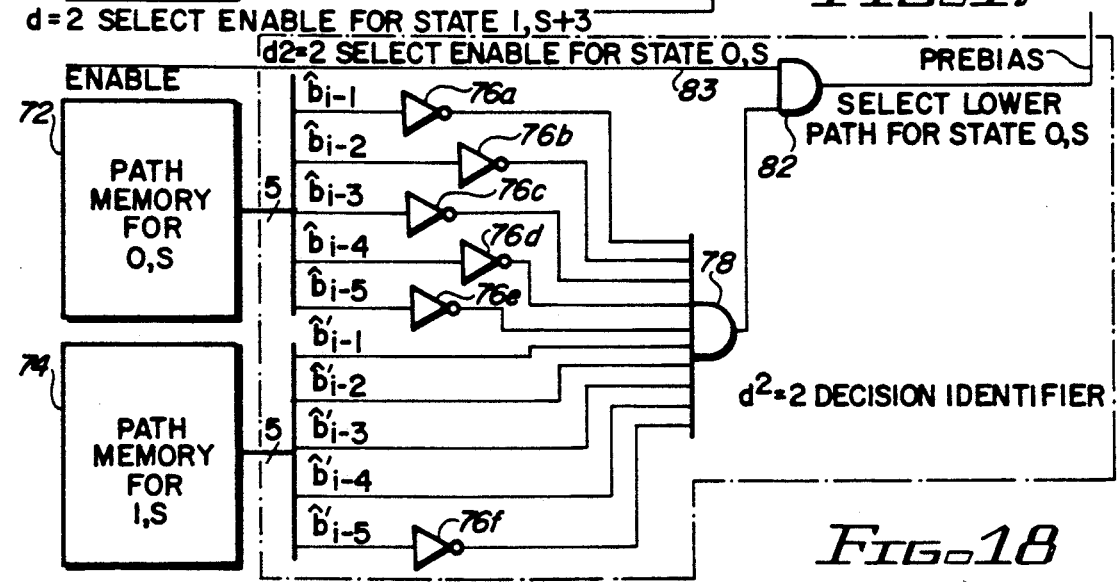
FIG. 18 depicts, according to the invention, a circuit diagram for prebiasing a specific minimum distance decision for the $(1-D)$ trellis of FIG. 11.

According to the present invention, Viterbi detector 13 is further modified by including in each ACS unit 100 the minimum distance decision identifier circuit 70 (FIG. 18), path memories 72, 74 and a MUX 108. When the control signal in line C is a logical zero, time variation provided by MUX 107 will be disabled, but an inverter 85 interposed between control line of C and line 83 will cause circuit 70 to be enabled. If the conditions described in connection with FIG. 18 are met to enable AND gate 78, AND gate 82 (FIG. 18) will be enabled by the select signal in lines 83. This will provide an output signal in line 84, thereby activating MUX 108 to provide the required minimum distance for state 0,S and concurrently activate MUX 105 to generate the same metric that would be produced if one of the edges state 0,S or for 1,S were deleted. In this manner, the minimum distance identifier circuit 70 can be incorporated into the time-varying trellis structure of the Viterbi detector described in the cited related application.

While the invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the claims:

Appendix A

This appendix describes coding of ten bit user bytes to sixteen bit constrained sequences in NRZI notation appropriate for the trellis of Figs. 6, 8, and 9. The encoder and decoder are state dependent, using the three states labelled 0, 1, and 2 in Fig. 10.

Coding is performed using several lists of codewords in hexadecimal, referred to as lists A, B, C, D, E, and F. Each is a list of sixteen bit codewords representing paths in the trellis of Figs. 6, 8, and 9 with certain allowed beginning and ending bits. The allowed sequences in each list are characterized as follows:

| List | Consists of sequences of the form |
|---|---|
| A | 0101 ... 0 |
| B | 0000 ... 0 |
|   | 0001 ... 0 |
|   | 0010 ... 0 |
|   | 0100 ... 0 |
| C | 1 ... 0 |
| D | 0000 ... 1 |
|   | 0001 ... 1 |
|   | 0010 ... 1 |
| E | 0100 ... 1 |
|   | 0101 ... 1 |
| F | 1 ... 1 |

The available sequences and the successor state from each state in the encoder is indicated in Figure 10. For example, the self-loop from state 0 to state 0 indicates that there are 372 usable sequences returning to state 0 which is the set union of lists A and C. To hereafter distinguish these sequences from the same set of sequences which have successor state 1, the set of sequences returning to state 0 is designated A00 U C00, while the set with successor state 1 is designated A01 U C01. There are 304 additional sequences starting at state 0 and ending at state 2 (denoted E02 U F02), for a total of 1048 sequences starting at state 0. Any one-to-one map of the 1024 combinations of ten bit user bytes to a subset of 1024 of the 1048 sequence/next state combinations starting at state 0 will serve as an encoder map for state 0. The inverse map serves as a decoder map for state 0.

Similarly, there are 1032 sequences starting at state 1, consisting of the 420 sequences of list B ending at state 0 (denoted B10), the 420 sequences of list B ending at state 1 (denoted B11), and the 192 sequences of list D (denoted D12) ending at state 2. Any one-to-one map of the 1024 combinations of ten bit user bytes to a subset of 1024 of the 1032 sequence/next state combinations starting at state 1 will serve as an encoder map for state 1. The inverse map serves as a decoder map for state 1.

There are 1306 sequences starting at state 2; 495 end at state 0 (denoted A20 U B20), 495 end at state 1 (denoted A21 U B21), and 315 return to state 2 (denoted D22 U E22). Any one-to-one map of the 1024 combinations of ten bit user bytes to a subset of 1024 of the 1306 sequence/next state combinations starting at state 2 will serve as an encoder map for state 2. The inverse map serves as a decoder map for state 2.

In order to decode, the starting and successor state for each sixteen bit sequence to be decoded must be identified. This is accomplished using simple boolean logic on certain bits of the preceeding, current, and succeeding codeword. If the last bit of the preceeding codeword is a one, the starting state is state 2; otherwise the starting state is 0 or 1. Since the lists A, B, C, D, E, and F are disjoint, the first four bits and the last bit of the current codeword discriminate between starting states 0 and 1. The same logic network determines the starting state of the successor codeword. When the starting state/next state of the current codeword have been identified, the appropriate inverse encoder map completes the decoding.

Table A1. List A

```
5004 500a 5010 5014 5022 5028 5040 5044
504a 5050 5054 5082 5088 5092 50a0 50a4
50aa 5100 5104 510a 5110 5114 5122 5128
5140 5144 514a 5150 5154 5202 5208 5212
5220 5224 522a 5242 5248 5252 5280 5284
528a 5290 5294 52a2 52a8 5400 5404 540a
5410 5414 5422 5428 5440 5444 544a 5450
5454 5482 5488 5492 54a0 54a4 54aa 5500
5504 550a 5510 5514 5522 5528 5540 5544
554a 5550 5554
```

Table A2. List B

```
10  14  22  28  40  44  4a  50
54  82  88  92  a0  a4  aa  100
104 10a 110 114 122 128 140 144
14a 150 154 202 208 212 220 224
22a 242 248 252 280 284 28a 290
294 2a2 2a8 400 404 40a 410 414
422 428 440 444 44a 450 454 482
488 492 4a0 4a4 4aa 500 504 50a
510 514 522 528 540 544 54a 550
554 802 808 812 820 824 82a 842
848 852 880 884 88a 890 894 8a2
8a8 902 908 912 920 924 92a 942
948 952 a00 a04 a0a a10 a14 a22
a28 a40 a44 a4a a50 a54 a82 a88
a92 aa0 aa4 aaa
```

```
1004 100a 1010 1014 1022 1028 1040 1044
104a 1050 1054 1082 1088 1092 10a0 10a4
10aa 1100 1104 110a 1110 1114 1122 1128
1140 1144 114a 1150 1154 1202 1208 1212
1220 1224 122a 1242 1248 1252 1280 1284
128a 1290 1294 12a2 12a8 1400 1404 140a
1410 1414 1422 1428 1440 1444 144a 1450
1454 1482 1488 1492 14a0 14a4 14aa 1500
```

1504 150a 1510 1514 1522 1528 1540 1544
154a 1550 1554

2008 2012 2020 2024 202a 2042 2048 2052
2080 2084 208a 2090 2094 20a2 20a8 2102
2108 2112 2120 2124 212a 2142 2148 2152
2200 2204 220a 2210 2214 2222 2228 2240
2244 224a 2250 2254 2282 2288 2292 22a0
22a4 22aa 2402 2408 2412 2420 2424 242a
2442 2448 2452 2480 2484 248a 2490 2494
24a2 24a8 2502 2508 2512 2520 2524 252a
2542 2548 2552 2804 280a 2810 2814 2822
2828 2840 2844 284a 2850 2854 2882 2888
2892 28a0 28a4 28aa 2900 2904 290a 2910
2914 2922 2928 2940 2944 294a 2950 2954
2a02 2a08 2a12 2a20 2a24 2a2a 2a42 2a48
2a52 2a80 2a84 2a8a 2a90 2a94 2aa2 2aa8

400a 4010 4014 4022 4028 4040 4044 404a
4050 4054 4082 4088 4092 40a0 40a4 40aa
4100 4104 410a 4110 4114 4122 4128 4140
4144 414a 4150 4154 4202 4208 4212 4220
4224 422a 4242 4248 4252 4280 4284 428a
4290 4294 42a2 42a8 4400 4404 440a 4410
4414 4422 4428 4440 4444 444a 4450 4454
4482 4488 4492 44a0 44a4 44aa 4500 4504
450a 4510 4514 4522 4528 4540 4544 454a
4550 4554 4802 4808 4812 4820 4824 482a
4842 4848 4852 4880 4884 488a 4890 4894
48a2 48a8 4902 4908 4912 4920 4924 492a
4942 4948 4952 4a00 4a04 4a0a 4a10 4a14
4a22 4a28 4a40 4a44 4a4a 4a50 4a54 4a82
4a88 4a92 4aa0 4aa4 4aaa Table A3. List C 8012 8020 8024 802a 8042 8048 8052 8080
8084 808a 8090 8094 80a2 80a8 8102 8108
8112 8120 8124 812a 8142 8148 8152 8200
8204 820a 8210 8214 8222 8228 8240 8244
824a 8250 8254 8282 8288 8292 82a0 82a4
82aa 8402 8408 8412 8420 8424 842a 8442
8448 8452 8480 8484 848a 8490 8494 84a2
84a8 8502 8508 8512 8520 8524 852a 8542
8548 8552 8804 880a 8810 8814 8822 8828
8840 8844 884a 8850 8854 8882 8888 8892
88a0 88a4 88aa 8900 8904 890a 8910 8914
8922 8928 8940 8944 894a 8950 8954 8a02
8a08 8a12 8a20 8a24 8a2a 8a42 8a48 8a52
8a80 8a84 8a8a 8a90 8a94 8aa2 8aa8 9002
9008 9012 9020 9024 902a 9042 9048 9052
9080 9084 908a 9090 9094 90a2 90a8 9102
9108 9112 9120 9124 912a 9142 9148 9152
9200 9204 920a 9210 9214 9222 9228 9240
9244 924a 9250 9254 9282 9288 9292 92a0
92a4 92aa 9402 9408 9412 9420 9424 942a
9442 9448 9452 9480 9484 948a 9490 9494
94a2 94a8 9502 9508 9512 9520 9524 952a
9542 9548 9552 a004 a00a a010 a014 a022
a028 a040 a044 a04a a050 a054 a082 a088
a092 a0a0 a0a4 a0aa a100 a104 a10a a110
a114 a122 a128 a140 a144 a14a a150 a154
a202 a208 a212 a220 a224 a22a a242 a248
a252 a280 a284 a28a a290 a294 a2a2 a2a8
a400 a404 a40a a410 a414 a422 a428 a440

```
a444 a44a a450 a454 a482 a488 a492 a4a0
a4a4 a4aa a500 a504 a50a a510 a514 a522
a528 a540 a544 a54a a550 a554 a802 a808
a812 a820 a824 a82a a842 a848 a852 a880
a884 a88a a890 a894 a8a2 a8a8 a902 a908
a912 a920 a924 a92a a942 a948 a952 aa00
aa04 aa0a aa10 aa14 aa22 aa28 aa40 aa44
aa4a aa50 aa54 aa82 aa88 aa92 aaa0 aaa4
aaaa
```

Table A4. List D

```
11  15  29  41  45  51  55  89
a1  a5  101 105 111 115 129 141
145 151 155 209 221 225 249 281
285 291 295 2a9 401 405 411 415
429 441 445 451 455 489 4a1 4a5
501 505 511 515 529 541 545 551
555 809 821 825 849 881 885 891
895 8a9 909 921 925 949 a01 a05
a11 a15 a29 a41 a45 a51 a55 a89
aa1 aa5

1005 1011 1015 1029 1041 1045 1051 1055
1089 10a1 10a5 1101 1105 1111 1115 1129
1141 1145 1151 1155 1209 1221 1225 1249
1281 1285 1291 1295 12a9 1401 1405 1411
1415 1429 1441 1445 1451 1455 1489 14a1
14a5 1501 1505 1511 1515 1529 1541 1545
1551 1555

2009 2021 2025 2049 2081 2085 2091 2095
20a9 2109 2121 2125 2149 2201 2205 2211
2215 2229 2241 2245 2251 2255 2289 22a1
22a5 2409 2421 2425 2449 2481 2485 2491
2495 24a9 2509 2521 2525 2549 2801 2805
2811 2815 2829 2841 2845 2851 2855 2889
28a1 28a5 2901 2905 2911 2915 2929 2941
2945 2951 2955 2a09 2a21 2a25 2a49 2a81
2a85 2a91 2a95 2aa9
```

Table A5. List E

```
4011 4015 4029 4041 4045 4051 4055 4089
40a1 40a5 4101 4105 4111 4115 4129 4141
4145 4151 4155 4209 4221 4225 4249 4281
4285 4291 4295 42a9 4401 4405 4411 4415
4429 4441 4445 4451 4455 4489 44a1 44a5
4501 4505 4511 4515 4529 4541 4545 4551
4555 4809 4821 4825 4849 4881 4885 4891
4895 48a9 4909 4921 4925 4949 4a01 4a05
4a11 4a15 4a29 4a41 4a45 4a51 4a55 4a89
4aa1 4aa5

5005 5011 5015 5029 5041 5045 5051 5055
5089 50a1 50a5 5101 5105 5111 5115 5129
5141 5145 5151 5155 5209 5221 5225 5249
5281 5285 5291 5295 52a9 5401 5405 5411
5415 5429 5441 5445 5451 5455 5489 54a1
54a5 5501 5505 5511 5515 5529 5541 5545
5551 5555
```

Table A6. List F

```
8021 8025 8049 8081 8085 8091 8095 80a9
8109 8121 8125 8149 8201 8205 8211 8215
8229 8241 8245 8251 8255 8289 82a1 82a5
8409 8421 8425 8449 8481 8485 8491 8495
84a9 8509 8521 8525 8549 8801 8805 8811
8815 8829 8841 8845 8851 8855 8889 88a1
88a5 8901 8905 8911 8915 8929 8941 8945
8951 8955 8a09 8a21 8a25 8a49 8a81 8a85
8a91 8a95 8aa9 9009 9021 9025 9049 9081
9085 9091 9095 90a9 9109 9121 9125 9149
9201 9205 9211 9215 9229 9241 9245 9251
9255 9289 92a1 92a5 9409 9421 9425 9449
9481 9485 9491 9495 94a9 9509 9521 9525
9549 a005 a011 a015 a029 a041 a045 a051
a055 a089 a0a1 a0a5 a101 a105 a111 a115
a129 a141 a145 a151 a155 a209 a221 a225
a249 a281 a285 a291 a295 a2a9 a401 a405
a411 a415 a429 a441 a445 a451 a455 a489
a4a1 a4a5 a501 a505 a511 a515 a529 a541
a545 a551 a555 a809 a821 a825 a849 a881
a885 a891 a895 a8a9 a909 a921 a925 a949
aa01 aa05 aa11 aa15 aa29 aa41 aa45 aa51
aa55 aa89 aaa1 aaa5
```

Appendix B

The code for Fig. 19 translates eight bits of user information to ten coded bits at a time in a state dependent manner. There are three lists of codewords which are used for coding purposes, which are called LISTAB, LISTE, and LISTFG.

LISTAB is a list of ten-bit trellis sequences in NRZ format which meet certain runlength constraints and which correspond to paths from state A or B to states E, F, G, or H in Fig. 19. LISTAB contains 293 sequences listed in hexadecimal. Any one-to-one map of the 256 possible eight bit user input bytes to a subset of 256 of the 293 sequences in LISTAB will serve as an encoder mapping in state A or B, and the inverse map will serve as the decoder mapping when the Viterbi detector indicates a sequence sourced from state A or B. The number of NRZ ones modulo 4 in each codeword and the last bit of each codeword determines the next encoder state as shown in Table B-1.

The list of sequences for state C or D is obtained by taking the bitwise complement of sequences in LISTAB. Again, any one-to-one mapping of the 256 user input combinations to a subset of the list will serve for coding purposes in state C or D. The number of NRZ ones modulo 4 in each codeword and the last bit of each codeword determines the next encoder state as shown in Table B-2.

An example sequence in LISTAB is 3bd (hexadecimal) = 11 1011 1101 (binary). Since the number of NRZ ones is 8 = 0 (mod 4), and the last bit is a one, the next state is state G. The complementary sequence, 00 0100 0010 is a path from state C or D to state F.

LISTE is a list of ten-bit trellis sequences in NRZ format which meet certain runlength constraints and which correspond to paths from state E to states A, B, C, or D in Fig. 19. LISTE contains 294 sequences listed in hexadecimal. Any one-to-one map of the 256 possible eight bit user input bytes to a subset of 256 of the 294 sequences in LISTE will serve as an encoder mapping, and the inverse map will serve as the decoder mapping when the Viterbi detector indicates a sequence sourced from state E. The number of NRZ ones modulo 4 in each codeword and the last bit of each codeword determines the next encoder state as shown in Table B-3.

The list of sequences for state H is obtained by taking the bitwise complement of sequences in LISTE. Again, any one-to-one mapping of the 256 user input combinations to a subset of the list will serve for coding purposes in state H. The number of NRZ ones modulo 4 in each codeword and the last bit of each codeword determines the next encoder state as shown in Table B-4.

LISTFG is a list of ten-bit trellis sequences in NRZ format which meet certain runlength constraints and which correspond to paths from state F or G to states A, B, C, or D in Fig. 19. LISTFG contains 292 sequences listed in hexadecimal. Any one-to-one map of the 256 possible eight bit user input bytes to a subset of 256 of the 292 sequences in LISTFG will serve as an encoder mapping, and the inverse map will serve as the decoder mapping when the Viterbi detector indicates a sequence sourced from state F or G. The number of NRZ ones modulo 4 in each codeword and the last bit of each codeword determines the next encoder state as shown in Table B-5.

Table 1: Next state for state A or B

| Number of NRZ ones modulo 4 | Last bit of codeword | Next state |
|---|---|---|
| 0 | 0 | F |
| 0 | 1 | G |
| 1 | 1 | E |
| 3 | 0 | H |

Table 2: Next state for state C or D

| Number of NRZ ones modulo 4 | Last bit of codeword | Next state |
|---|---|---|
| 2 | 0 | F |
| 2 | 1 | G |
| 3 | 1 | E |
| 1 | 0 | H |

Table 3: Next state for state E

| Number of NRZ ones modulo 4 | Last bit of codeword | Next state |
|---|---|---|
| 1 | 0 | A |
| 1 | 1 | B |
| 3 | 0 | C |
| 3 | 1 | D |

Table 4: Next state for state H

| Number of NRZ ones modulo 4 | Last bit of codeword | Next state |
|---|---|---|
| 3 | 0 | A |
| 3 | 1 | B |
| 1 | 0 | C |
| 1 | 1 | D |

Table 5: Next state for state F or G

| Number of NRZ ones modulo 4 | Last bit of codeword | Next state |
|---|---|---|
| 2 | 0 | A |

Table 5: Next state for state F or G

| Number of NRZ ones modulo 4 | Last bit of codeword | Next state |
|---|---|---|
| 2 | 1 | B |
| 0 | 1 | C |
| 0 | 0 | D |

Table 5. LISTAB

```
43 45 49 4b 4d 4e 51 53 55 56 59 5a 5c 5e 61 63
65 66 69 6a 6c 6e 71 72 74 76 7a 85 89 8b 8d 8e
91 93 95 96 99 9a 9c 9e a1 a3 a5 a6 a9 aa ac ae
b1 b2 b4 b6 ba bc c3 c5 c6 c9 ca cc ce d1 d2 d4
d6 da dc e1 e2 e4 e6 ea ec f2 f4 109 10b 10d 10e 111
113 115 116 119 11a 11c 11e 121 123 125 126 129 12a 12c 12e 131
132 134 136 13a 13c 143 145 146 149 14a 14c 14e 151 152 154 156
15a 15c 161 162 164 166 16a 16c 172 174 17b 185 186 189 18a 18c
18e 191 192 194 196 19a 19c 1a1 1a2 1a4 1a6 1aa 1ac 1b2 1b4 1bb
1bd 1c2 1c4 1c6 1ca 1cc 1d2 1d4 1db 1dd 1e2 1e4 1eb 1ed 211 213
215 216 219 21a 21c 21e 221 223 225 226 229 22a 22c 22e 231 232
234 236 23a 23c 243 245 246 249 24a 24c 24e 251 252 254 256 25a
25c 261 262 264 266 26a 26c 272 274 27b 285 286 289 28a 28c 28e
291 292 294 296 29a 29c 2a1 2a2 2a4 2a6 2aa 2ac 2b2 2b4 2bb 2bd
2c2 2c4 2c6 2ca 2cc 2d2 2d4 2db 2dd 2e2 2e4 2eb 2ed 2f3 2f5 309
30a 30c 30e 311 312 314 316 31a 31c 321 322 324 326 32a 32c 332
334 33b 33d 342 344 346 34a 34c 352 354 35b 35d 362 364 36b 36d
373 375 379 37b 384 386 38a 38c 392 394 39b 39d 3a2 3a4 3ab 3ad
3b3 3b5 3b9 3bb 3bd
```

Table 6. LISTE

```
43 45 46 49 4a 4c 51 52 54 5b 5d 5e 61 62 64 6b
6d 6e 73 75 76 79 7a 85 86 89 8a 8c 91 92 94 9b
9d 9e a1 a2 a4 ab ad ae b3 b5 b6 b9 ba bc c2 c4
cb cd ce d3 d5 d6 d9 da dc e3 e5 e6 e9 ea ec f1
f2 f4 109 10a 10c 111 112 114 11b 11d 11e 121 122 124 12b 12d
12e 133 135 136 139 13a 13c 142 144 14b 14d 14e 153 155 156 159
15a 15c 163 165 166 169 16a 16c 171 172 174 17b 184 18b 18d 18e
193 195 196 199 19a 19c 1a3 1a5 1a6 1a9 1aa 1ac 1b1 1b2 1b4 1bb
1bd 1c3 1c5 1c6 1c9 1ca 1cc 1d1 1d2 1d4 1db 1dd 1de 1e1 1e2 1e4
1eb 1ed 1ee 211 212 214 21b 21d 21e 221 222 224 22b 22d 22e 233
235 236 239 23a 23c 242 244 24b 24d 24e 253 255 256 259 25a 25c
263 265 266 269 26a 26c 271 272 274 27b 284 28b 28d 28e 293 295
296 299 29a 29c 2a3 2a5 2a6 2a9 2aa 2ac 2b1 2b2 2b4 2bb 2bd 2c3
2c5 2c6 2c9 2ca 2cc 2d1 2d2 2d4 2db 2dd 2de 2e1 2e2 2e4 2eb 2ed
2ee 2f3 2f5 2f6 30b 30d 30e 313 315 316 319 31a 31c 323 325 326
329 32a 32c 331 332 334 33b 33d 343 345 346 349 34a 34c 351 352
354 35b 35d 35e 361 362 364 36b 36d 36e 373 375 376 379 37a 385
386 389 38a 38c 391 392 394 39b 39d 39e 3a1 3a2 3a4 3ab 3ad 3ae
3b3 3b5 3b6 3b9 3ba 3bc
```

Table 7. LISTFG

```
42 44 4b 4d 4e 53 55 56 59 5a 5c 63 65 66 69 6a
6c 71 72 74 7b 84 8b 8d 8e 93 95 96 99 9a 9c a3
a5 a6 a9 aa ac b1 b2 b4 bb bd c3 c5 c6 c9 ca cc
d1 d2 d4 db dd de e1 e2 e4 eb ed ee f3 f5 f6 10b
10d 10e 113 115 116 119 11a 11c 123 125 126 129 12a 12c 131 132
134 13b 13d 143 145 146 149 14a 14c 151 152 154 15b 15d 15e 161
162 164 16b 16d 16e 173 175 176 179 17a 185 186 189 18a 18c 191
192 194 19b 19d 19e 1a1 1a2 1a4 1ab 1ad 1ae 1b3 1b5 1b6 1b9 1ba
1bc 1c2 1c4 1cb 1cd 1ce 1d3 1d5 1d6 1d9 1da 1dc 1e3 1e5 1e6 1e9
1ea 1ec 213 215 216 219 21a 21c 223 225 226 229 22a 22c 231 232
234 23b 23d 243 245 246 249 24a 24c 251 252 254 25b 25d 25e 261
262 264 26b 26d 26e 273 275 276 279 27a 285 286 289 28a 28c 291
292 294 29b 29d 29e 2a1 2a2 2a4 2ab 2ad 2ae 2b3 2b5 2b6 2b9 2ba
2bc 2c2 2c4 2cb 2cd 2ce 2d3 2d5 2d6 2d9 2da 2dc 2e3 2e5 2e6 2e9
2ea 2ec 2f1 2f2 2f4 309 30a 30c 311 312 314 31b 31d 31e 321 322
324 32b 32d 32e 333 335 336 339 33a 33c 342 344 34b 34d 34e 353
355 356 359 35a 35c 363 365 366 369 36a 36c 371 372 374 37b 384
38b 38d 38e 393 395 396 399 39a 39c 3a3 3a5 3a6 3a9 3aa 3ac 3b1
3b2 3b4 3bb 3bd
```

We claim:

1. A method for maximum likelihood detection of a high rate trellis code, comprising the steps of:
   using an encoder, encoding sequences of digital electrical signals constituting input data into sequences of coded bits;
   inputting said sequences of coded bits to a partial response channel;
   supplying a channel response to the coded bits, corrupted by noise, to a Viterbi detector constructed by interconnecting N copies of a trellis structure associated with the channel;
   using the detector to provide as output sequences maximum likelihood estimates of the sequences of the coded bits; and
   tracking with the detector a predetermined attribute of each sequence of coded bits modulo N for increasing minimum distance between said output sequences.

2. The method of claim 1, including the step of:
   time-varying said trellis structure to allow only certain values of said tracked predetermined attribute periodically in time to eliminate quasi-catastrophic sequences.

3. The method of claim 1, wherein the predetermined attribute is a weighted sum modulo N of the coded bits using a predetermined sequence of weights.

4. The method of claim 1, wherein the partial response channel has the characteristic polynomial $(1+D-D^2-D^3)$, and the predetermined attribute is the sum of alternate input bits in NRZI notation modulo N.

5. The method of claim 4, wherein $N=2$.

6. The method of claim 1, wherein the partial response channel has the characteristic polynomial $(1-D)$, and the predetermined attribute is a running digital sum of consecutive input bits in NRZ notation.

7. The method of claim 6, wherein the partial response channel has the characteristic polynomial $(1-D^n)$, where n is a nonnegative integer, and the channel is deinterleaved into n channels of the form $(1-D)$.

8. The method of claim 1, wherein the partial response channel has the characteristic polynomial $(1+D)$, and the predetermined attribute is a digital sum of the consecutive input bits in NRZ notation obtained by adding input bits in even index positions and subtracting input bits in odd index position.

9. The method of claim 8, wherein the partial response channel has the characteristic polynomial $(1+D^n)$, where n is a nonnegative integer, and the channel is deinterleaved into n channels of the form $(1+D)$.

10. The method of claim 1, including the step of:
    selecting the sequences of coded bits from trellis sequences in the trellis structure which do not contain subsequences that require minimum distance decisions by the detector.

11. The method of claim 1, including the steps of:
    identifying in the trellis structure trellis sequences which contain a pair of minimum distance subsequences;
    prebiasing the detector to favor only one of the subsequences of each pair; and
    using only the favored subsequences from each pair in the trellis code.

12. The method of claim 1, including the steps of:
    selecting some of the sequences of coded bits from trellis sequences of the trellis structure which do not contain subsequences that require minimum distant decisions by the detector;
    providing in the trellis structure other trellis sequences containing minimum distance subsequences;
    prebiasing the detector to favor only one of the subsequences in each such other trellis sequence; and
    constructing the trellis code using a combination of the trellis sequences containing the favored subsequences and trellis sequences without subsequences.

13. A method for constructing a trellis structure and an associated trellis code for increasing minimum distance between output sequences of digital electrical signals transmitted over a partial response channel, comprising the steps of:
    preselecting a weighting function that maps channel input sequences to a selected integer value modulo N;
    interconnecting N Viterbi detectors, each having m channel states, each such state representing the most recent input to the partial response channel, for creating a modified trellis structure for a modified Viterbi detector having n times m states each representing a combination of a channel state and a particular value of the weighting function; and
    determining the value of N and constraints for the channel input sequences and the modified detector for increasing the minimum distance between output sequences by insuring that pairs of noiseless output sequences originating at a common state in the modified detector do not remerge at the minimum distance.

14. The method of claim 13, including the step of selecting as the trellis code one that uses a subset of sequences that corresponds to paths through the modified trellis structure from which selected states and edges have been deleted and incorporates the constraints for the channel input sequences.

15. The method of claim 13, including the steps, to eliminate quasi-catastrophic sequences from the trellis code, of:
    deleting selected states and/or edges from the modified trellis structure to eliminate multiple paths having identical noiseless channel output sequences; and
    selecting as the trellis code one which is a subset of the quasi-catastrophic sequences permitted by the modified trellis structure.

16. A method for increasing the minimum distance between output sequences of partial response channels having a plurality of states without requiring codes with spectral nulls, comprising the steps of:
    encoding digital electrical signals constituting user input data into encoded sequences of bits which are input to the channel;
    preselecting a weighting function which maps each of the encoded sequences, in NRZ or NRZI notation, to an integer value modulo N;
    interconnecting N Viterbi detectors each having a plurality of trellis states to create a modified Viterbi detector having N times said plurality of trellis states, where each state in the modified detector is associated with a corresponding channel state and a corresponding value of the weighting function;
    determining the value of N and channel input and detector constraints which ensure that sequences of minimum distance emanating from a common state in the modified detector lead to different detector states;

deleting from the modified detector trellis states and/or edges emanating from the trellis states from a trellis to eliminate multiple paths with identical noiseless sample values; and selecting a code which is a subset of nonquasi-catastrophic sequences that correspond to permissible paths through the modified detector.

17. Apparatus for maximum likelihood detection of a high rate trellis code, comprising:

an encoder for encoding sequences of digital electrical signals constituting input data into sequences of coded bits;

a partial response channel having a trellis structure and operative to generate a channel response to said sequences of coded bits; and a Viterbi detector constructed by interconnecting N copies of the trellis structure for receiving said channel response, corrupted by noise, and generating as output sequences maximum likelihood estimates of the sequences of the coded bits, and tracking a predetermined attribute of each sequence of coded bits modulo N for increasing minimum distance between said output sequences.

18. The apparatus of claim 17, including:

means for time-varying said trellis structure to allow only certain values of said tracked predetermined attribute periodically in time to eliminate quasi-catastrophic sequences.

19. The apparatus of claims 17, wherein:

the sequences of coded bits are from sequences of the trellis structure without subsequences that requiring minimum distance decisions by the detector.

20. The apparatus of claim 17, wherein the trellis structure has trellis sequences which contain a pair of minimum distance subsequences, and including circuitry for prebiasing the detector to favor only one of the subsequences of each pair for use in the trellis code.

21. The apparatus of claim 17, wherein some of the sequences of coded bits contain a pair of subsequences that require minimum distant decisions by the detector; and the other sequences of coded bits do not contain such subsequences, and including circuitry for prebiasing the detector to favor one of the subsequences in each pair to construct the trellis code by use of a combination of sequences that contain subsequences and those that do not contain said subsequences.

* * * * *